US012787301B2

(12) United States Patent
Yang et al.

(10) Patent No.: US 12,787,301 B2
(45) Date of Patent: Nov. 3, 2026

(54) METAL CHALCOGENIDE FILM, MEMORY ELEMENT INCLUDING SAME, AND METHOD FOR MANUFACTURING PHASE-CHANGE HETEROLAYER

(71) Applicants: Samsung Electronics Co., Ltd., Suwon-si (KR); UIF (University Industry Foundation), Yonsei University, Seoul (KR)

(72) Inventors: Wooyoung Yang, Suwon-si (KR); Hyungjun Kim, Seoul (KR); Hajun Sung, Suwon-si (KR); Kiyeon Yang, Suwon-si (KR); Changseung Lee, Suwon-si (KR); Changyup Park, Suwon-si (KR); Seung-min Chung, Seoul (KR); Sangyoon Lee, Seoul (KR); Inkyu Sohn, Seoul (KR)

(73) Assignees: Samsung Electronics Co., Ltd., Gyeonggi-do (KR); UIF (University Industry Foundation), Yonsei University, Seoul (KR)

( * ) Notice: Subject to any disclaimer, the term of this patent is extended or adjusted under 35 U.S.C. 154(b) by 492 days.

(21) Appl. No.: 18/348,846

(22) Filed: Jul. 7, 2023

(65) Prior Publication Data

US 2024/0057347 A1 Feb. 15, 2024

(30) Foreign Application Priority Data

Aug. 9, 2022 (KR) ........................ 10-2022-0099432

(51) Int. Cl.
*H10B 63/10* (2023.01)
*H10B 63/00* (2023.01)
(Continued)

(52) U.S. Cl.
CPC ............. *H10B 63/10* (2023.02); *H10B 63/20* (2023.02); *H10N 70/023* (2023.02);
(Continued)

(58) Field of Classification Search
CPC ...... H10B 63/10; H10B 63/20; H10N 70/023; H10N 70/231; H10N 70/826;
(Continued)

(56) References Cited

U.S. PATENT DOCUMENTS 10,418,552 B1 * 9/2019 Fantini ..................... G11C 7/18
12,207,572 B2 * 1/2025 Koo ..................... H10N 70/023
(Continued)

FOREIGN PATENT DOCUMENTS

CN 103794723 A 5/2014
CN 108461628 A 8/2018
(Continued)

OTHER PUBLICATIONS

Paul A. Merolla et al., "A million spiking-neuron integrated circuit with a scalable communication network and interface", Science, 345.6197: 668-673 (2014).
(Continued)

*Primary Examiner* — Eduardo A Rodela
(74) *Attorney, Agent, or Firm* — HARNESS, DICKEY & PIERCE, P.L.C.

(57) ABSTRACT

A memory element includes a substrate, a first electrode formed on the substrate, a phase-change heterolayer formed on the first electrode and electrically connected to the first electrode, and a second electrode formed on the phase-change heterolayer, wherein the phase-change heterolayer includes one or more confinement material layers and one or more phase-change material layers, and the confinement material layer includes a metal chalcogenide film.

8 Claims, 2 Drawing Sheets

100

(51) Int. Cl.
*H10N 70/00* (2023.01)
*H10N 70/20* (2023.01)

(52) U.S. Cl.
CPC ......... *H10N 70/231* (2023.02); *H10N 70/826* (2023.02); *H10N 70/828* (2023.02); *H10N 70/882* (2023.02); *H10N 70/8822* (2023.02); *H10N 70/8825* (2023.02)

(58) Field of Classification Search
CPC ............. H10N 70/828; H10N 70/8822; H10N 70/8825; H10N 70/8828; H10N 70/011; H10N 70/882; H10N 70/235
See application file for complete search history.

(56) References Cited

U.S. PATENT DOCUMENTS

| | | | | |
|---|---|---|---|---|
| 12,266,712 | B2 * | 4/2025 | Penumatcha | H10B 61/22 |
| 12,317,765 | B2 * | 5/2025 | Tong | H10N 70/231 |
| 2008/0096386 | A1 | 4/2008 | Park et al. | |
| 2017/0170237 | A1 | 6/2017 | Jung | |
| 2018/0337331 | A1 * | 11/2018 | Reinecke | H10N 70/8828 |
| 2023/0082400 | A1 | 3/2023 | Koo et al. | |

FOREIGN PATENT DOCUMENTS

| | | | |
|---|---|---|---|
| CN | 110212088 | A | 9/2019 |
| CN | 113611798 | A | 11/2021 |
| KR | 10-2008-0035844 | A | 4/2008 |
| KR | 10-2017-0069893 | A | 6/2017 |
| KR | 10-2259289 | B1 | 8/2019 |
| KR | 10-2119306 | B1 | 11/2019 |
| KR | 10-2023-0039128 | A | 3/2023 |

OTHER PUBLICATIONS

Yoon Kyeung Lee et al., “Atomic layer deposition of chalcogenides for next-generation phase change memory”, Journal of Materials Chemistry C 2021, 9.11: 3708-3725 (2021).

Keyuan Ding et al., “Phase-change heterostructure enables ultralow noise and drift for memory operation”, Science, 366.6462: 210-215 (2019).

Mattia Boniardi et al., “Statistics of Resistance Drift Due to Structural Relaxation in Phase-Change Memory Arrays”, IEEE Transactions on Electron Devices, 57.10: 2690-2696 (2010).

N. A. Bogoslovskiy et al., “Physics of Switching and Memory Effects in Chalcogenide Glassy Semiconductors”, Semiconductors, 46.5: 559-590 (2012).

Xudong Wang et al., “Bonding nature and optical contrast of TiTe2/Sb2Te3 phase-change heterostructure”, Materials Science in Semiconductor Processing 135, 106080 (2021).

Korean Office Action dated Dec. 10, 2025 issued in Korean Patent Application No. 10-2022-0099432 (with translation).

* cited by examiner

METAL CHALCOGENIDE FILM, MEMORY ELEMENT INCLUDING SAME, AND METHOD FOR MANUFACTURING PHASE-CHANGE HETEROLAYER

CROSS-REFERENCE TO RELATED APPLICATION

This application is based on and claims priority under 35 U.S.C. § 119 to Korean Patent Application No. 10-2022-0099432, filed on Aug. 9, 2022, in the Korean Intellectual Property Office, the disclosure of which is incorporated by reference herein in its entirety.

BACKGROUND

Various example embodiments relate to a metal chalcogenide film, a memory element including the same, and/or a method of preparing a phase-change heterolayer.

In recent years, in line with the trend of miniaturization/reduction and high performance of electronic devices, there is a demand or desire for a memory device capable of storing information in various electronic devices, such as a computer, a portable communication apparatus, and the like. Such a memory device includes memory devices such as phase-change random access memory (PRAM), which is capable of storing data by switching between different resistance states according to an applied voltage or electric current. Such PRAMs have improved scaling potential compared to existing memory technologies.

The phase-change heterolayer of PRAM may include phase-change materials and confinement materials. However, deposition of the phase-change materials and/or of the confinement materials may be difficult.

SUMMARY

Provided is a memory device including a phase-change heterolayer having improved memory capacity as well as high operating speed and/or low power consumption.

Additional aspects will be set forth in part in the description which follows and, in part, will be apparent from the description, or may be learned by practice of various example embodiments.

According to some example embodiments, a metal chalcogenide film includes a transition metal element and a chalcogen element, and has an octahedral crystal structure.

Alternatively or additionally, according to some example embodiments, a memory element includes a substrate, a first electrode on the substrate, a phase-change heterolayer on the first electrode and electrically connected to the first electrode, and a second electrode on the phase-change heterolayer. The phase-change heterolayer includes one or more confinement material layers and one or more phase-change material layers, and at least one of the one or more confinement material layers includes the metal chalcogenide film.

Alternatively or additionally, a method of preparing a phase-change heterolayer includes, preparing a substrate, forming a confinement material layer including a metal chalcogenide on the substrate, and forming a phase-change material layer including a phase-change material. The forming of a confinement material layer and the forming of a phase-change material layer are conducted in the same reaction chamber.

BRIEF DESCRIPTION OF THE DRAWINGS

The above and other aspects, features, and advantages of certain example embodiments will be more apparent from the following description taken in conjunction with the accompanying drawings, in which.

DETAILED DESCRIPTION

Figure 1:
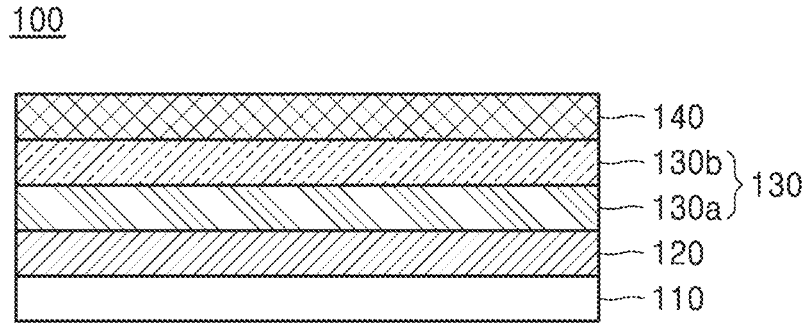
FIGS. 1 and 2 are cross-sectional views of a memory element according to various example embodiments.

Reference will now be made in detail to some embodiments, examples of which are illustrated in the accompanying drawings, wherein like reference numerals refer to like elements throughout. In this regard, various and variously described embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinbelow, when an element is described as being "above" or "on" another element, the element may be immediately on top of and in physical contact with the another element, or may be above the another element without contact. In some example embodiments a first element described as being on another second element may include the first element being at least partially within the second element. As used herein, the singular forms are intended to include the plural forms as well, unless the context clearly indicates otherwise. Also, when one element is described as "comprising," and/or "including" another element, this does not preclude the presence or addition of one or more other elements, unless otherwise indicated.

As used herein, the article "the" and other similar terms may correspond to both a singular term and a plural term. With regard to the processes constituting a method, such processes may be performed in any appropriate order and are not necessarily limited to the order described herein, unless an explicit indication to the contrary is made herein.

The connections or connecting members of the lines between the components illustrated in the drawings only illustrate functional connections and/or physical or circuit connections, and in an actual device, various functional connections, physical connections, or as circuit connections may be possible.

All example terms used herein are only for the purpose of describing the technical concept in detail, and the scope of the claims is not limited by these examples or exemplary terms, unless limited by the claims.

According to some example embodiments, disclosed is a metal chalcogenide film including a transition metal element and a chalcogen element, and having an octahedral crystal structure.

A metal chalcogenide film according to various example embodiments may not have a tetrahedral crystal structure.

In a metal chalcogenide film according to various example embodiments, the transition metal element may be Ti, Zr, Hf, V, Nb, Ta, Mo, W, Tc, Re, Co, Rh, Ir, Ni, Pd, Pt, Zn or Sn, and the chalcogen element may be S or Se.

In a metal chalcogenide film according to various example embodiments, the transition metal element may be Ti and the chalcogen element may be S.

In a metal chalcogenide film according to various example embodiments, the transition metal element and the chalcogen element both may not exhibit an in-plane concentration gradient.

In a metal chalcogenide film according to various example embodiments, the transition metal element and the chalcogen element may not exhibit a concentration gradient in a direction perpendicular to each other along a surface of the metal chalcogenide film.

A memory element according to another embodiment may include a substrate, a first electrode located on the substrate, a phase-change heterolayer located on the first electrode and electrically connected to the first electrode, and a second electrode located on the phase-change heterolayer. the phase-change heterolayer may include one or more confinement material layers and one or more phase-change material layers, and the confinement material layers may include a metal chalcogenide film according to various example embodiments.

In a memory element according to various example embodiments, the confinement material layers and the phase-change material layers may be deposited in an alternating fashion.

In a memory element according to various example embodiments, the confinement material layers and the phase-change material layers may be films deposited by atomic layer deposition (ALD).

In a memory element according to various example embodiments, the confinement material layers may directly contact the first electrode, or the phase-change material layers may directly contact the first electrode.

In a memory element according to various example embodiments, the memory element may include two or more confinement material layers, and the confinement material layers may be deposited apart from one other. In this case, there may be one or more phase-change material layers between the two or more confinement material layers.

In a memory element according to various example embodiments, the memory element may include two or more phase-change material layers, and the phase-change material layers may be deposited apart from one another. In this case, there may be one or more confinement material layers between the two or more phase-change material layers.

In a memory element according to various example embodiments, the confinement material layers may include Ti and S, and the confinement material layers may not include Te.

In a memory element according to various example embodiments, the phase-change heterolayer may include two or more confinement material layers, and the confinement material layers each independently may have a thickness of about 1 nm to about 5 nm.

In a memory element according to various example embodiments, the phase-change heterolayer may include two or more phase-change material layers, and the phase-change material layers each independently may have a thickness of about 1 nm to about 20 nm.

In a memory element according to various example embodiments, the total thickness of a phase-change heterolayer may be about 2 nm to about 70 nm.

In a memory element according to various example embodiments, the thickness of the confinement material layer may be smaller than the thickness of the phase-change material layer.

In a memory element according to various example embodiments, the phase-change heterolayer may include ten or less confinement material layers and ten or less phase-change material layers. The confinement material layers may be deposited apart from one another, the phase-change material layers may be deposited apart from one another, and the confinement material layers and the phase-change material layers may be deposited in an alternating fashion.

In a memory element according to various example embodiments, the first electrode and the second electrode may each independently include one or more selected from among carbon (C), titanium nitride (TiN), titanium silicon nitride (TiSiN), titanium carbon nitride (TiCN), titanium carbon silicon nitride (TiCSiN), titanium aluminum nitride (TiAlN), tantalum (Ta), tantalum nitride (TaN), tungsten (W), and tungsten nitride (WN).

The first electrode and the second electrode are not limited to any particular shape. For example, the first electrode and the second electrode may each independently be formed in a thin-film form, a cylindrical form, a form including a pattern, or the like. Additionally or alternatively, the contact area between the first electrode and the phase-change heterolayer may be different from the contact area between the second electrode and the phase-change heterolayer.

In a memory element according to various example embodiments, the phase-change material layer includes a phase-change material, and the phase-change material may include two or more elements selected from among Ga, Si, Ge, Sb, Te, Bi, In, Sn, and Se.

In a memory element according to various example embodiments, the phase-change material may include one or more selected from among GaSb, InSb, InSe, $Sb_2Te_3$, GeTe, GeSbTe, GaSeTe, InSbTe, $SnSb_2Te_4$, InSbGe, AgInSbTe, (GeSn)SbTe, GeSb(SeTe), and $Te_{81}Ge_{15}Sb_2S_2$.

In a memory element according to various example embodiments, the phase-change material may further include a dopant, and the dopant may include one or more elements selected from among In, S, Si, Se, Ti, Sc, and Bi. In addition, the dopant may be included in an amount of about 1 parts by weight to about 10 parts by weight with respect to 100 parts by weight of the phase-change material layer. By including a dopant, by including a dopant in the phase-change material layer, thermal stability of the phase-change material layer may be improved, and the melting point and crystallization rate thereof may be adjusted.

A method of preparing a phase-change heterolayer according to another embodiment may include preparing a substrate, forming a confinement material layer including a metal chalcogenide on the substrate, and forming a phase-change material layer including a phase-change material. The process of forming a confinement material layer and the process of forming a phase-change material layer may be conducted in the same reaction chamber. For example, the process of forming the confinement layer and the process of forming the phase-change material layer may be performed in the same reaction chamber in an in-situ manner, and the substrate may not be removed from the reaction chamber between the process of forming the phase-change material layer and the process of forming the confinement layer.

In a method of preparing a phase-change heterolayer according to various example embodiments, the process of forming a confinement material layer and the process of forming a phase-change material layer may be conducted in a vacuum state. In some example embodiments, the vacuum may not be interrupted between forming the phase-change layer and forming the confinement material layer.

In a method of preparing a phase-change heterolayer according to various example embodiments, the process of forming a confinement material layer and the process of forming a phase-change material layer may be conducted by atomic layer deposition (ALD) process.

In a method of preparing a phase-change heterolayer according to various example embodiments, the process of forming a confinement material layer and the process of forming a phase-change material layer may be each conducted twice or more and may be conducted in an alternating fashion. As a result, the confinement material layers may be deposited apart from one another, and the phase-change material layers may be deposited apart from one another.

In a method of preparing a phase-change heterolayer according to various example embodiments, the process of forming a confinement material layer may be conducted prior to the process of forming a phase-change material layer. As a result, the first electrode and the confinement material layer may be in direct contact with each other.

In a method of preparing a phase-change heterolayer according to various example embodiments, the process of forming a phase-change material layer may be conducted prior to the process of forming a confinement material layer. As a result, the first electrode and the phase-change material layer may be in direct contact with each other.

In a method of preparing a phase-change heterolayer according to various example embodiments, the substrate may include at least one selected from among silicon, silicon oxide, aluminum oxide, magnesium oxide, silicon carbide, silicon nitride, glass, quartz, sapphire, graphite, graphene, a polyimide copolymer, polyimide, polyethylene naphthalate (PEN), fluoropolymer (FEP), and polyethylene terephthalate (PET).

In a method of preparing a phase-change heterolayer according to various example embodiments, the process of forming a confinement material layer may include supplying a transition metal precursor into a reaction chamber; purging by supplying an inert gas into the reaction chamber; supplying a chalcogen precursor into the reaction chamber; and purging by supplying an inert gas into the reaction chamber. As a result, the transition metal element and the chalcogen element may be deposited alternatingly, and a thin film containing the transition metal element and the chalcogen element may have an octahedral crystal structure.

In a method of preparing a phase-change heterolayer according to various example embodiments, the transition metal precursor may include at least one element selected from among Ti, Zr, Hf, V, Nb, Ta, Mo, W, Tc, Re, Co, Rh, Ir, Ni, Pd, Pt, Zn and Sn, and in particular, the transition metal precursor may be a Ti precursor.

In a method of preparing a phase-change heterolayer according to various example embodiments, the Ti precursor may be titanium tetrachloride ($TiCl_4$), titanium tetrafluoride ($TiF_4$), titanium tetrakis(isopropoxide) ($Ti(O\text{-}iPr)_4$), cyclopentadienyl titanium, titanium bis(isopropoxide)bis(2,2,6,6-tetramethyl-3,5-heptanedionate) ($Ti(O\text{-}iPr)_2(thd)_2$), tetrakisdimethylaminotitanium ($Ti[N(CH_3)_2]_4$, TDMAT), tetrakis (diethylamino)titanium ($(Et_2N)_4Ti$, TEMAT), titanium silylamide, or derivatives thereof.

In a method of preparing a phase-change heterolayer according to various example embodiments, the chalcogen precursor may include S and/or Se, and may not include Te. As the chalcogen precursor does not include Te, which is highly volatile, the formation of a metal chalcogenide film may be uniformly performed, patterns of the metal chalcogenide film may be densely formed, and/or diversity in the patterns (e.g., a pattern with a large step) may be ensured.

In a method of preparing a phase-change heterolayer according to various example embodiments, the chalcogen precursor may include at least one selected from among sulfur, hydrogen sulfide ($H_2S$), diethyl sulfide, dimethyl disulfide, ethyl methyl sulfide, $(Et_3Si)_2S$, selenium vapor, hydrogen selenide ($H_2Se$), diethyl selenide, dimethyl diselenide, ethyl methyl selenide, and $(Et_3Si)_2Se$.

In a method of preparing a phase-change heterolayer according to various example embodiments, the chalcogen precursor may be hydrogen sulfide ($H_2S$). As the chalcogen precursor hydrogen sulfide, the formation of a metal chalcogenide film may be uniformly performed, patterns of the metal chalcogenide film may be densely formed, and diversity in the patterns (e.g., a pattern with a large step) may be ensured or may be more likely to be ensured.

A metal chalcogenide film according to various example embodiments has a uniform and dense octahedral crystal structure, and thus may have high thermal stability and/or small lattice parameters. Additionally or alternatively, since the metal chalcogenide film has an electrical conductivity and electron configuration similar to phase-change material, the metal chalcogenide film may be used as a confinement material in order to compensate for thermal stability of phase-change material.

A phase-change heterolayer according to various example embodiments may include a confinement material layer and a phase-change material layer, and the confinement material layer may include the metal chalcogenide film. The confinement material layer and the phase-change material layer may be sequentially deposited, and the confinement material layer may improve thermal stability of the phase-change material layer. For example, by employing the confinement material layer, permanent changes in crystal lattices and/or dislocations of constituent atoms therefrom due to a phase change of the phase-change material may be restricted or reduced in likelihood of occurrence. As a result, longevity and phase-change efficiency of the phase-change material layer may be improved.

Additionally or alternatively, a method of preparing a phase-change heterolayer according to various example embodiments may be conducted in a single reaction chamber, e.g. with an in-situ process. Since the process of forming a confinement material layer and the process of forming a phase-change material layer are conducted in the same reaction chamber without the substrate being removed from the reaction chamber, confinement material layers and phase-change material layers may be uniformly or more uniformly deposited, and/or interfaces of the confinement material layers and interfaces of the phase-change material layers may be more densely attached together. As a result, the confinement material layers and the phase-change material layers may be formed to share a particular three-dimensional pattern.

Additionally or alternatively, a method of preparing a phase-change heterolayer according to various example embodiments may be conducted in a reaction chamber in a vacuum state, e.g. a continuous or unbroken vacuum state. Since deposition of the phase-change material layer on the confinement material layer, or deposition of the confinement material layer on the phase-change material layer takes place in a vacuum state, interfacial characteristics of the confinement material layer and phase-change material layer may be improved. For example, the concentration of impurities on the interfaces may be reduced, and/or uniformity of the interfaces may be improved.

Additionally or alternatively, a method of preparing a phase-change heterolayer according to various example embodiments may be performed by atomic layer deposition (ALD). As a result, the confinement material layer and phase-change material layer may be deposited such that the crystal lattices of each of the confinement material layer and phase-change material layer are uniform or more uniform. Alternatively or additionally, a nanometer-scale control over the thicknesses of the confinement material layer and phase-change material layer may be possible.

Accordingly, a memory element including a phase-change heterolayer according to various example embodiments may have improved operating speed and/or memory capacity, and/or reduced power consumption.

Hereinbelow, with reference to the accompanied drawings, a memory element including a phase-change material will be described in detail. In the drawings hereinbelow, like reference numerals are used to denote like features, and the size of each feature illustrated in the drawings may be exaggerated for clarity and convenience of description. In addition, various example embodiments described below are provided for illustrative purposes only, and various modifications are possible from these embodiments.

Figure 2:
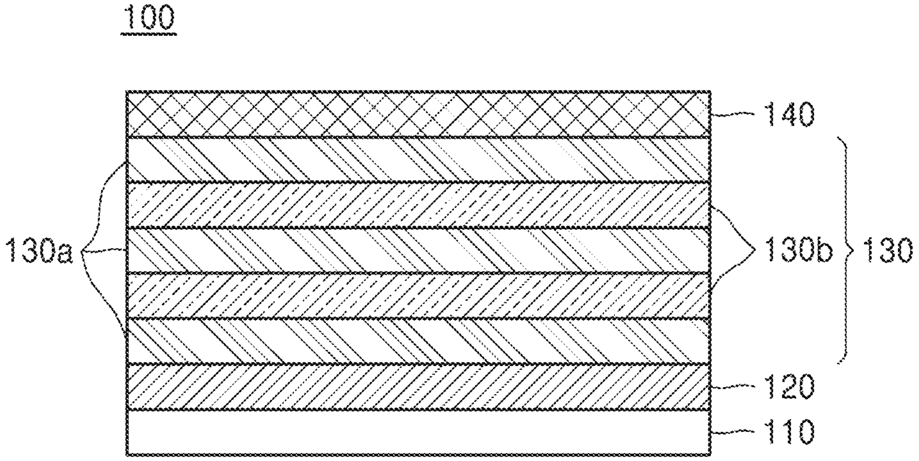

FIG. 1 and FIG. 2 are cross-sectional views of a memory element according to various example embodiments.

Referring to FIG. 1, a memory element 100 may include a first electrode 120, a phase-change heterolayer 130, and a second electrode 140, that may be on a substrate 110. The phase-change heterolayer 130 may include a confinement material layer 130*a* and a phase-change material layer 130*b*. The phase-change heterolayer 130 may be electrically connected to the first electrode 120 and the second electrode 140, respectively, and the confinement material layer 130*a* and the phase-change material layer 130*b* may also be electrically connected to the first electrode 120 and the second electrode 140, respectively.

Referring to FIG. 1, the first electrode 120 and the confinement material layer 130*a* may wholly or at least partially be in direct contact with each other, and the second electrode 140 and the phase-change material layer 130*b* may wholly or at least partially be in direct contact with each other. Additionally, the phase-change material layer 130*b* may be deposited so as to be wholly or at least partially in direct contact with the first electrode 120, and the confinement material layer 130*a* may be deposited so as to be wholly or at least partially in direct contact with the second electrode 140. For example, the substrate 110, the first electrode 120, the phase-change material layer 130*b*, the confinement material layer 130*a*, and the second electrode 140 may be sequentially deposited. Thicknesses of each of the first electrode 120, the phase-change material layer 130*b*, the confinement material layer 130*a*, and the second electrode 140 may be the same as each other, or at least one of the first electrode 120, the phase-change material layer 130*b*, the confinement material layer 130*a*, and the second electrode 140 may have a thickness different from at least another of the first electrode 120, the phase-change material layer 130*b*, the confinement material layer 130*a*, and the second electrode 140

Referring to FIG. 2, the memory element 100 may include two or more confinement material layers 130*a* and two or more phase-change material layers 130*b*. The confinement material layer 130*a* and the phase-change material layer 130*b* may be alternately deposited one or more times on a substrate 110 to be parallel to the substrate 110. Additionally or alternatively, the memory element 100 may include an odd number of confinement material layers 130*a* and an even number of phase-change material layers 130*b*. In this case, as shown in FIG. 2, the confinement material layer 130*a* may directly contact the first electrode 120 and the second electrode 140. Thicknesses of the two or more confinement material layers 130*a* and the two or more phase-change material layers 130*b* may be the same as one another, or alternatively a thickness of at least one of the two or more confinement material layers 130*a* and the two or more phase-change material layers 130*b* may be different than at least another of the two or more confinement material layers 130*a* and the two or more phase-change material layers 130*b*.

Additionally or alternatively, the memory element 100 may include an even number of confinement material layers 130*a* and an odd number of phase-change material layers 130*b*. In this case, unlike FIG. 2, the phase-change material layer 130*b* may directly contact the first electrode 120 and the second electrode 140.

Meanwhile, the phase-change material layers 130*b* may serve to store information. In particular, the phase-change material layers 130*b* may have a resistance value that varies according to an applied voltage. A memory device (not illustrated) may store and/or delete digital information such as logical '0' or logical '1', according to resistance changes of the phase-change material layers 130*b*.

For example, the memory device may set the high resistance state of the phase-change material layer 130*b* as '0' and the low resistance state as '1'. Here, setting from the high resistance state '0' to the low resistance state '1' may be referred to as 'set operation' and setting from the low resistance state '1' to the high resistance state '0' may be referred to as 'reset operation'.

The phase-change material layer 130*b* may be transformed to one state of a plurality of resistance states by an electric pulse applied thereto. The phase-change material layer 130*b* may include a phase-change material of which the crystalline state changes by an electric current intensity. A phase-change material may transform to an amorphous state having a relatively high resistance, or alternatively to a crystalline state having a relatively low resistance. A phase-change material may reversibly change its phase by Joule heat generated by a voltage applied to both terminals of a memory element, and through such phase changes, data may be stored in a memory device.

A method of operating a memory device will be briefly described below. In a memory device, an electric current may flow as a voltage is applied to a phase-change material layer 130*b* of a memory element 100 through a first electrode 120 and a second electrode 140.

In addition, by selection of the first electrode 120 and the second electrode 140, any specific memory element 100 may be addressed, and by applying a signal between selected first electrode 120 and second electrode 140, information may be stored in the memory element 100. Alternatively or additionally, by measuring a current value through the second electrode 140, information according to a resistance value of the phase-change material layer 130*b* of the corresponding memory element 100, that is, programmed information may be read.

From the above, according to various example embodiments, it may be confirmed that there may be provided a memory device including a phase-change material that has improved memory capacity while having high operating speed and low power consumption.

Figure 3:
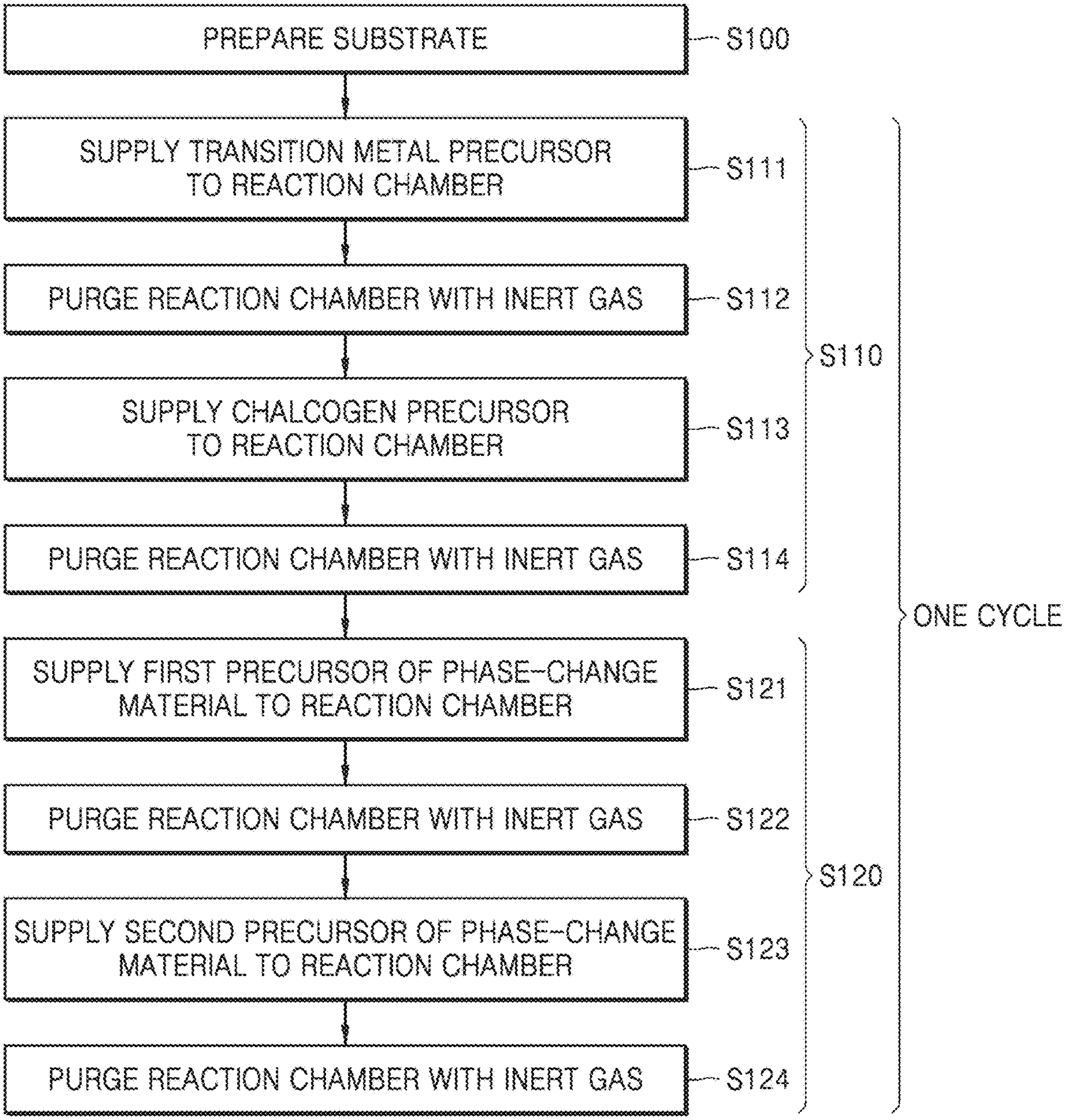
FIG. 3 is a flowchart illustrating a method of preparing a phase-change heterolayer according to various example embodiments.

FIG. 3 is a flowchart illustrating a method of preparing a phase-change heterolayer according to various example embodiments. A method of preparing a phase-change heterolayer according to various example embodiments may include preparing a substrate (S100), forming a confinement material layer (S110), and forming a phase-change material layer (S120). As described above, the process of forming a phase-change material layer (S120) may be performed prior to the process of forming a confinement material layer (S110). In addition, the process of forming a confinement material layer (S110) and the process of forming a phase-change material layer (S120) may each be performed multiple times.

A method of preparing a phase-change heterolayer according to various example embodiments may be initiated by preparing a substrate in a reaction chamber (S100). For example, a substrate 100 may include at least one selected from among silicon, silicon oxide, aluminum oxide, magnesium oxide, silicon carbide, silicon nitride, glass, quartz, sapphire, graphite, graphene, a polyimide copolymer, polyimide, polyethylene naphthalate (PEN), fluoropolymer (FEP), and polyethylene terephthalate (PET). The type/material of the substrate 100 is not limited to the aforementioned and may vary.

The phase-change heterolayer may be formed on a wafer having a size of six inches (150 mm) or more. For example, the substrate 100 may be a wafer having a size of six inches (150 mm) or more, such as but not limited to eight inches (200 mm) or twelve inches (300 mm). A method of preparing a phase-change heterolayer according to various example embodiments may be appropriate for large-scale growth. In addition, the method in various example embodiments may be applied to a substrate having a size of six inches or less, such as but not limited to four inches (100 mm).

Meanwhile, a transition metal precursor may be supplied to a reaction chamber provided with the substrate 100 for growing a phase-change heterolayer according to various example embodiments. For example, the transition metal precursor may include at least one element selected from among Ti, Zr, Hf, V, Nb, Ta, Mo, W, Tc, Re, Co, Rh, Ir, Ni, Pd, Pt, Zn and Sn, and in particular, the transition metal precursor may be a Ti precursor. Specific examples of the transition metal precursors are as described above.

In addition, the transition metal precursor may further include a precursor material having at least one dopant. The dopant may include one or more elements selected from among In, S, Si, Se, Ti, Sc, and Bi. In addition, the dopant may be included in an amount of about 1 parts by weight to about 10 parts by weight with respect to 100 parts by weight of the phase-change material layer. By including a dopant in the phase-change material layer, thermal stability of the phase-change material layer may be improved, and/or the melting point and crystallization rate thereof can be adjusted. The dopant may be included or incorporated during deposition, and/or through an ion implantation process; example embodiments are not limited thereto.

Following the process of supplying a transition metal precursor (S111), the process of purging by supplying an inert gas to the reaction chamber (S112) may be conducted. By purging with an inert gas, unreacted materials remaining in the reaction chamber may be removed. For example, as the inert gas, a gas containing an element from among the noble gases and/or gases such as dimers from among group 15 of the periodic table, such as nitrogen gas ($N_2$), may be considered.

Subsequently, a chalcogen precursor may be supplied into the reaction chamber (S101). According to various example embodiments, the chalcogen precursor may include a chalcogen element, S and/or Se. Specific examples of the chalcogen precursor are as described above.

According to various example embodiments, the chalcogen precursor may be supplied separately from the above-described transition metal precursor. Here, being supplied separately may mean that the transition metal precursor and the chalcogen precursor are supplied sequentially. In this case, for example, the transition metal precursor may be supplied first, and then, the chalcogen precursor may be supplied.

Following the process of supplying a chalcogen precursor (S113), the process of purging by supplying an inert gas to the reaction chamber (S114) may be conducted. By purging with an inert gas, unreacted materials remaining in the reaction chamber may be removed. For example, as the inert gas, a gas containing an element of Group 15, such as nitrogen gas ($N_2$), may be considered.

In the process of supplying a transition metal precursor (S111) and the supplying a chalcogen precursor (S113), the supply amounts of the transition metal precursor and the chalcogen precursor may be appropriately selected. In addition, the process of supplying a transition metal precursor (S111) and the process of supplying a chalcogen precursor (S113) may each be conducted multiple times. By varying the number of times the process of supplying a transition metal precursor (S111) and the process of supplying a chalcogen precursor (S113) are each conducted, the thickness of a confinement material layer 130*a* may be controlled.

Following the completion of one cycle of the process of forming a confinement material layer (S110), the process of forming a phase-change material layer 130*a* (S120) may be performed. The process of forming a phase-change material layer (S120) may include supplying a first precursor of a phase-change material to a reaction chamber (S121), the process of purging by supplying an inert gas to the same reaction chamber (S122), supplying a second precursor of a phase-change material to the same reaction chamber (S123), and the process of purging by supplying an inert gas to the same reaction chamber (S124).

According to various example embodiments, the first precursor and second precursor of the phase-change material may each include an element selected from among Ga, Si, Ge, Sb, Te, Bi, In, Sn, and Se, and the element included in the first precursor and the element included in the second precursor may be different from each other. As a result, the phase-change material may include two elements selected from among Ga, Si, Ge, Sb, Te, Bi, In, Sn, and Se.

According to various example embodiments, following the process of supplying a second precursor of a phase-change material to the reaction chamber (S123), supplying of a third precursor of a phase-change material (not illustrated) and supplying of a fourth precursor (not illustrated) may be additionally performed. As a result, the phase-change material may include two or more elements selected from among Ga, Si, Ge, Sb, Te, Bi, In, Sn, and Se.

According to various example embodiments, the phase-change material may include one or more selected from among GaSb, InSb, InSe, $Sb_2Te_3$, GeTe, GeSbTe, GaSeTe, InSbTe, $SnSb_2Te_4$, InSbGe, AgInSbTe, (GeSn)SbTe, GeSb (SeTe), and Test $Ge_{15}Sb_2S_2$.

In addition, in the process of supplying a first precursor (S121) and the process of supplying a second precursor (S123), the supply amounts of the first precursor and the second precursor may be appropriately selected. In addition, the process of supplying a first precursor (S121) and the process of supplying a second precursor (S123) may each be conducted multiple times, e.g. within the same reaction chamber. By varying the number of times the process of supplying a first precursor (S121) and the process of supplying a second precursor (S123) are each conducted, the thickness of a phase-change material layer 130*b* may be controlled.

In various example embodiments, the process of forming of a confinement material layer (S110) and the process of forming of a phase-change material layer (S120) may be conducted in the same reaction chamber, e.g. concurrently without removing the substrate from within the reaction chamber. In the process of forming a confinement material layer (S110) and the process of forming a phase-change material layer (S120), the processes other than the process of purging with an inert gas may be conducted in a vacuum condition.

In some example embodiments, the process of forming of a confinement material layer (S110) and the process of forming of a phase-change material layer (S120) may both be performed by atomic layer deposition (ALD).

In a case in which the process of forming a confinement material layer (S110) is performed by ALD, the duration of the process of supplying a transition metal precursor (S111) may be shorter than the duration of the process of supplying a chalcogen precursor (S113). The duration of the process of supplying a transition metal precursor (S111) may be half or less of the duration for the process of supplying a chalcogen precursor (S113), and may be ¼ or less thereof.

A memory device including a phase-change material is described with reference to embodiments illustrated in the drawings, but this is for illustrative purposes only, and it will be apparent to those skilled in the art that various modifications to and equivalent embodiments from these embodiments are possible. Therefore, various example embodiments disclosed herein should be considered not in a limiting sense, but for descriptive purposes. Therefore, the scope of protection should be defined not by the description provided above, but by the following claims, and all modifications, equivalents, and alternatives thereof should be construed as falling within the spirit and scope of protection.

According to various example embodiments disclosed herein, a memory element may include a phase-change heterolayer and the phase-change heterolayer may include a metal chalcogenide film as a confinement material. As a result, thermal stability of the phase-change heterolayer may be improved, the operating speed and memory capacity of the memory element may be improved, and/or the power consumption thereof may be reduced.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

It should be understood that variously described embodiments should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A memory element comprising:
a substrate;
a first electrode on the substrate;
a phase-change heterolayer on the first electrode and electrically connected to the first electrode; and
a second electrode on the phase-change heterolayer,
wherein the phase-change heterolayer includes one or more confinement material layers and one or more phase-change material layers, and
at least one of the one or more confinement material layers include a metal chalcogenide film, the metal chalcogenide film including,
a transition metal element, and
a chalcogen element, wherein
the metal chalcogenide film has an octahedral crystal structure.

2. The memory element of claim 1,
wherein the one or more confinement material layers and the one or more phase-change material layers are alternatingly deposited.

3. The memory element of claim 1,
wherein the one or more confinement material layers include Ti and S.

4. The memory element of claim 1,
wherein the phase-change heterolayer comprises two or more confinement material layers, and
the two or more confinement material layers each independently have a thickness of about 1 nm to about 5 nm.

5. The memory element of claim 1,
wherein the phase-change heterolayer comprises two or more phase-change material layers, and
the two or more phase-change material layers each independently have a thickness of about 1 nm to about 20 nm.

6. The memory element of claim 1,
wherein a total thickness of the phase-change heterolayer is about 5 nm to about 70 nm.

7. The memory element of claim 1,
wherein the one or more phase-change material layers comprise a phase-change material, and
the phase-change material comprises two or more elements selected from Ga, Si, Ge, Sb, Te, Bi, In, Sn, and Se.

8. The memory element of claim 7,
wherein the phase-change material comprises one or more selected from among GaSb, InSb, InSe, $Sb_2Te_3$, GeTe, GeSbTe, GaSeTe, InSbTe, $SnSb_2Te_4$, InSbGe, AgInSbTe, (GeSn) SbTe, GeSb(SeTe), and $Te_{81}Ge_{15}Sb_2S_2$.

* * * * *